United States Patent [19]
Hirasawa

[11] 3,976,984
[45] Aug. 24, 1976

[54] LEVEL SHIFTING CIRCUIT DEVICE

[75] Inventor: Masataka Hirasawa, Yokohama, Japan

[73] Assignee: Tokyo Shibaura Electric Co., Ltd., Kawasaki, Japan

[22] Filed: May 19, 1975

[21] Appl. No.: 578,810

[52] U.S. Cl. .................. 340/173 R; 340/172.5; 307/238
[51] Int. Cl.$^2$ .................. G11C 11/40; G11C 13/00
[58] Field of Search ....... 340/173 R, 173 BB, 172.5; 307/238, 279

[56] References Cited
UNITED STATES PATENTS
3,852,723  12/1974  Wu................................. 340/173 R Primary Examiner—Terrell W. Fears
Attorney, Agent, or Firm—Cushman, Darby & Cushman

[57] ABSTRACT

A level shifting circuit device comprises a first terminal connected to a high voltage power source, a P channel type IG-FET whose source and substrate electrodes are connected to said first terminal, means for applying a first pulse signal to the gate electrode of the P channel IG-FET, an N channel type IG-FET whose drain electrode is connected to the drain electrode of the P channel type IG-FET, an output terminal connected to a connecting point for connecting the drain electrodes of the P channel type and N channel type IG-FET's means for applying a specified voltage to the gate electrode of the N channel type IG-FET, an OR gate so connected as to supply an output to the source electrode of the N channel type IG-FET, means for supplying to the input terminals of the OR gate a second pulse signal synchronized with the first pulse signal and a low amplitude logic signal from the immediately preceding logic circuit to the level shifting circuit device, a capacitor connected between the substrate electrode of the N channel type IG-FET and the output terminal, and means for grounding the substrate electrode of the N channel type IG-FET, whereby only when the output from the OR gate has a 0 level as the low amplitude logic signal is shifted to a 0 level, a charge in the capacitor is discharged passing through the N channel IG-FET to cause the voltage level of the output terminal to become 0; and except for said time the capacitor is charged by the high amplitude power source to obtain high amplitude output 1 from the output terminal.

19 Claims, 27 Drawing Figures

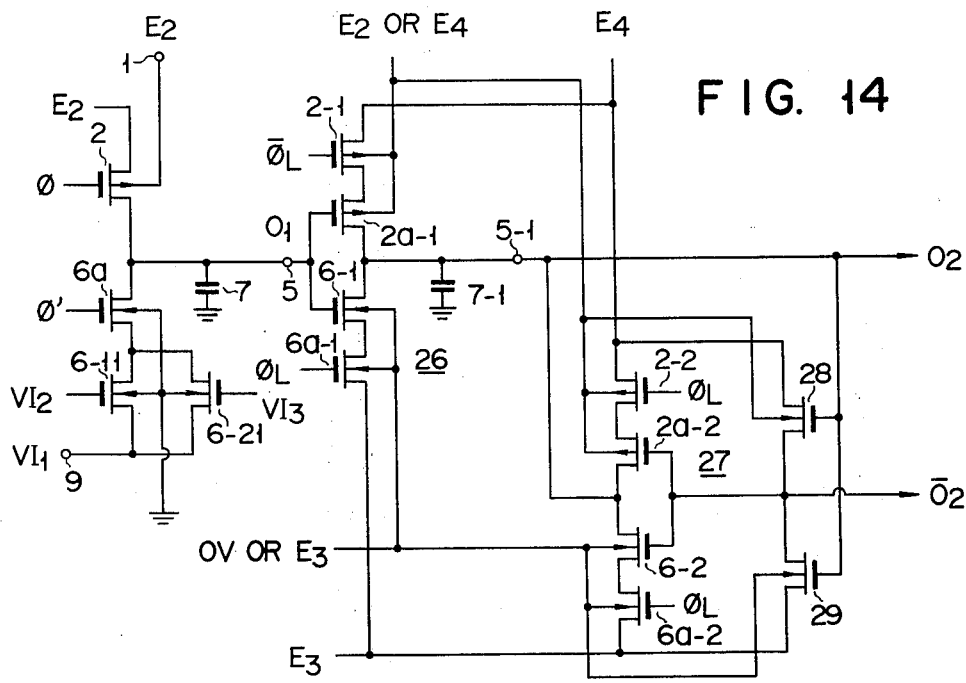
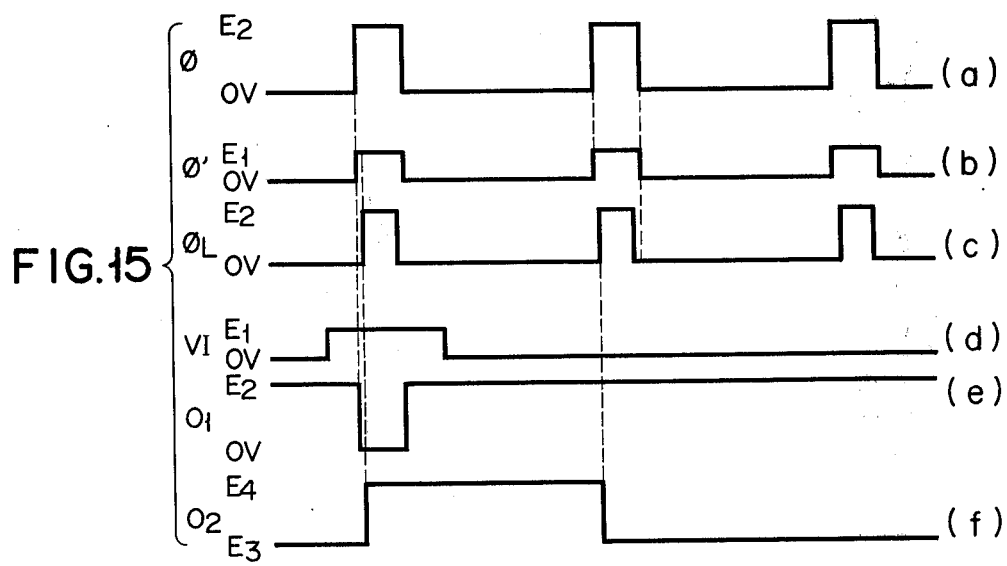

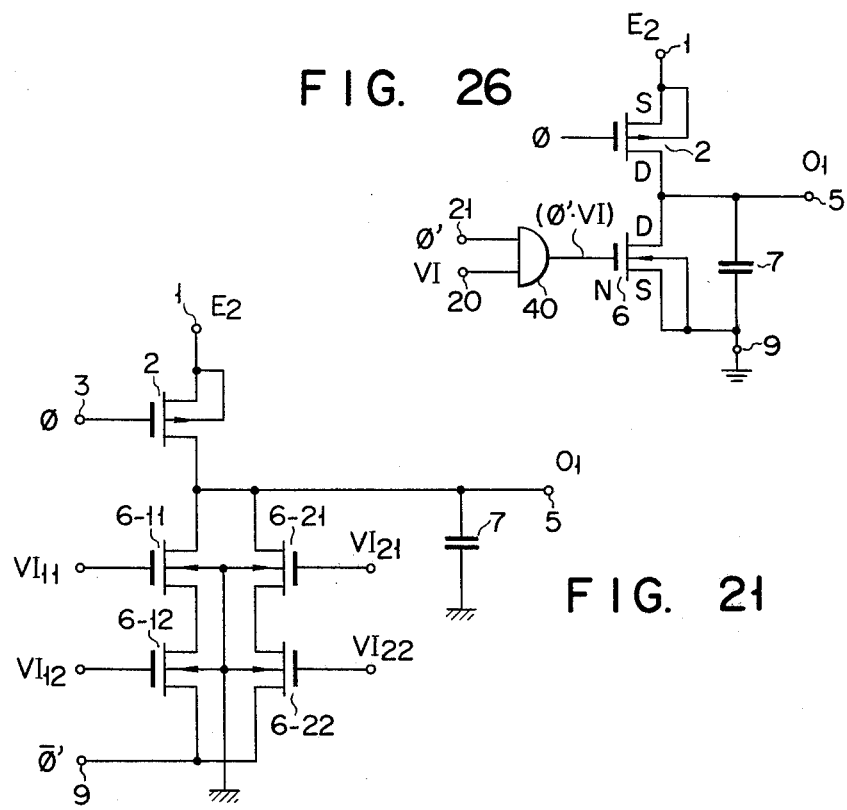
FIG. 26
FIG. 21
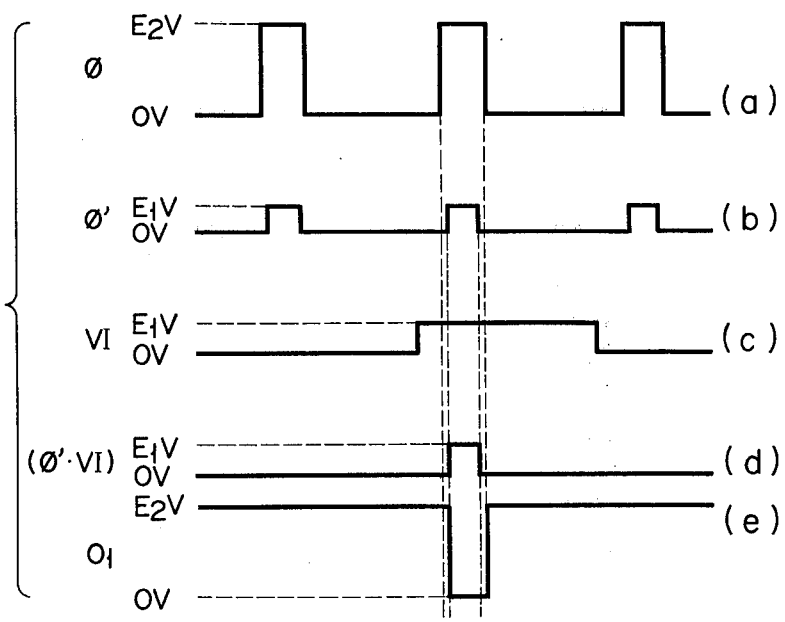
FIG. 27

FIG. 22
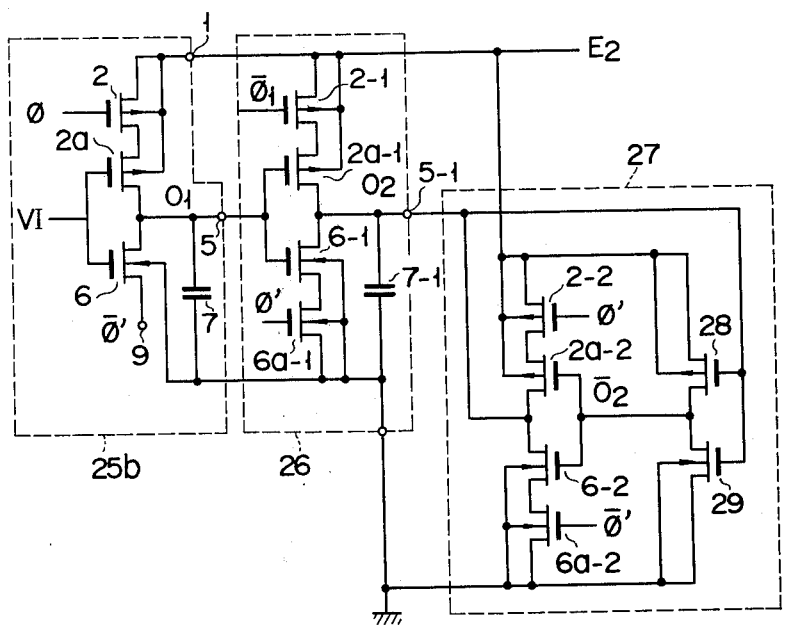
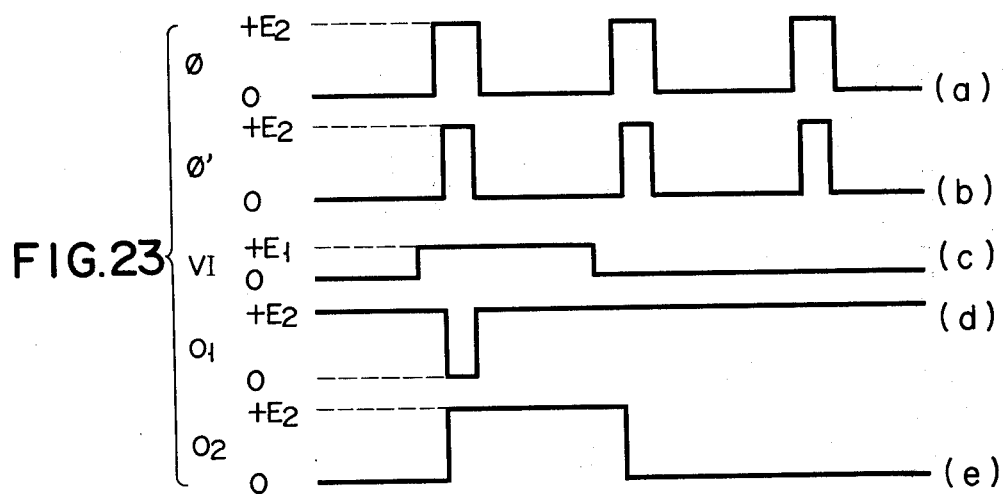
FIG. 23

FIG. 24
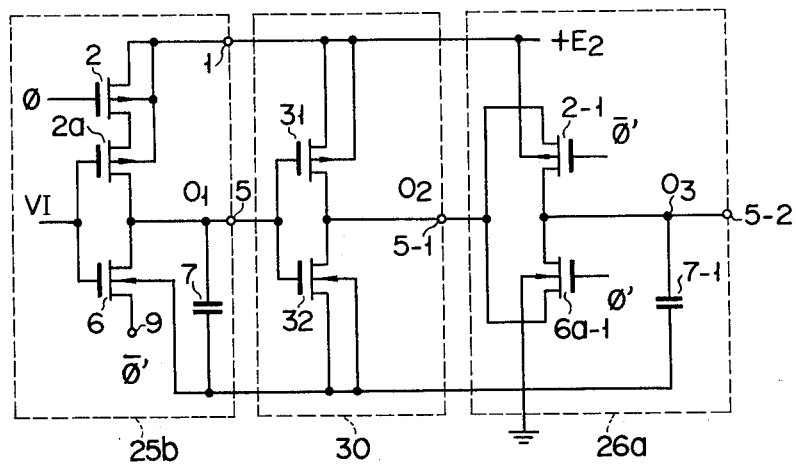
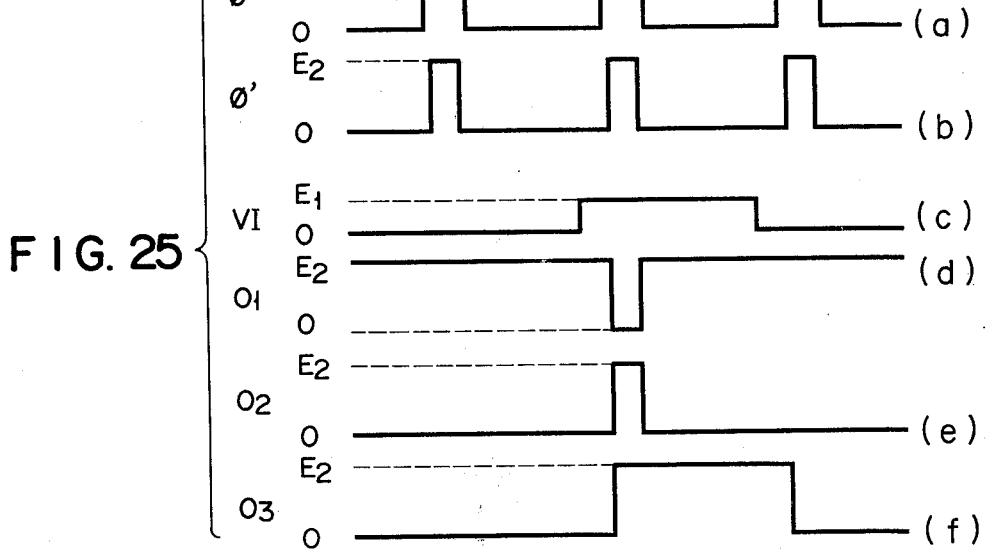
FIG. 25

LEVEL SHIFTING CIRCUIT DEVICE

This invention relates to a level shifting circuit device having a complementary logic circuit constructed using P channel type and N channel type insulated gate field effect transistors (whose singular form is hereinafter referred to as IG-FET).

Today, there is an increasing demand for reduction in power consumption of a device using an integrated circuit (which is hereinafter referred to as IC). This demand is particularly prominent with respect to an IC device for use in a wrist watch. Accordingly, there has been developed as a time counting logic circuit the IC which operates with as low an amplitude as possible (for example, 1.5 volts) and whose power consumption is several $\mu$W or less. On the other hand, however, there is needed a circuit which operates with high amplitude (for example, 10 volts), in order to drive a time display apparatus. As a result, a circuit for signally connecting such low amplitude logic circuit to such high amplitude display driving circuit, that is, a level shifting circuit is required. Generally, this level shifting circuit has a tendency of becoming large in the amount of power consumed. The conventional method for reducing such amount of power consumed has the drawbacks that the number of elements used is increased, the circuit design is difficult and complicated, or the chip size is difficult to miniaturize.

Accordingly the object of the invention is to provide a level shifting circuit device which is small in power consumption, simple in construction, easy to design and is constructed so that the chip size can be miniaturized.

According to the invention, there can be obtained a level shifting circuit device comprising a first terminal connected to a high amplitude power source, an output terminal, a first conductive path formed between the first terminal and the output terminal which includes a first IG-FET of one conductive channel type whose first electrode is connected to the first terminal, means for applying a first pulse signal to the first IG-FET, a reference voltage input terminal, a second conductive path formed between the reference voltage input terminal and the output terminal so as to include a second IG-FET of the other conductive channel type, means for generating a second pulse signal of specified polarity substantially synchronized with the first pulse signal, and a circuit arrangement for rendering the second IG-FET conductive when the second pulse signal has coincided with a low amplitude logic signal from a logic circuit immediately preceding the level shifting circuit device, wherein only when the second pulse signal and the logic signal have coincided with each other, a reference voltage output is obtained; and except for said time a high amplitude output is obtained through the first conductive path.

This invention can be more fully understood from the following detailed description when taken in conjunction with the accompanying drawings, in which:

FIG. 14 is a modification of the circuit arrangement of FIG. 12;

FIG. 15 illustrates signal waveforms for explaining the operation of the modified circuit arrangement of FIG. 14;

FIG. 21 is a modification of the circuit of FIG. 19;

FIG. 22 is a circuit arrangement prepared by adding a storage circuit and a stabilizer circuit to the circuit of FIG. 19;

FIG. 23 illustrates signal waveforms for explaining the operation of the circuit arrangement of FIG. 22;

FIG. 24 is a modification of the circuit arrangement of FIG. 22;

FIG. 25 illustrates signal waveforms for explaining the operation of the modified circuit of FIG. 24;

FIG. 26 is a circuit diagram illustrating a level shifting circuit according to another embodiment of the invention; and FIG. 27 illustrates signal waveforms for explaining the operation of the circuit of FIG. 26.

Figure 1:
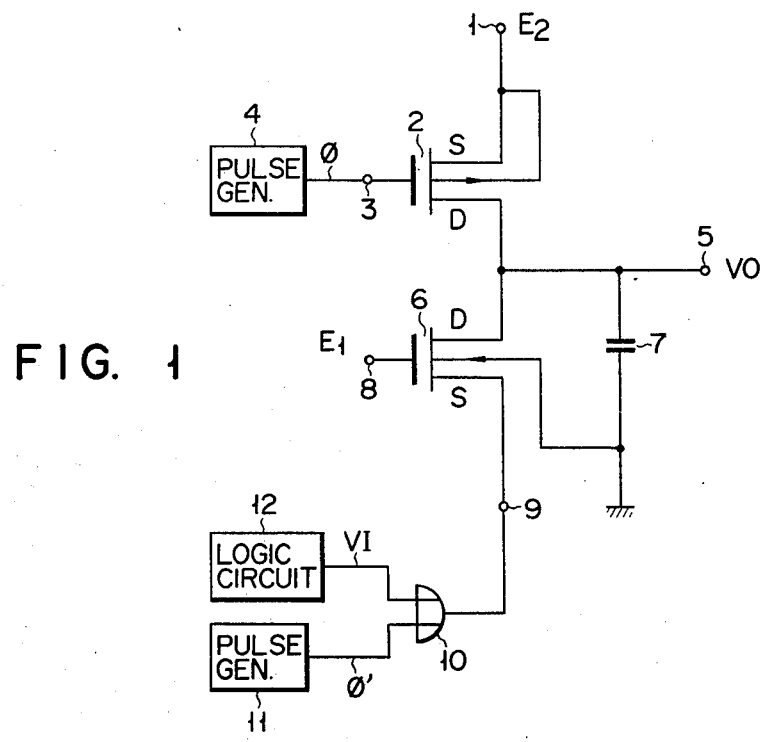
FIG. 1 is a circuit diagram illustrating a level shifting circuit according to an embodiment of the invention.

In FIG. 1, a power source terminal 1 is connected to a power source having a DC high voltage of, for example, +10 volt. In this connection, a negative DC voltage source also may be used by suitably connecting IG-FET's. This DC high voltage is generally represented by $E_2$. The power source terminal is connected to the source electrode and substrate electrode of a P channel type IG-FET 2. To the gate terminal 3 of the IG-FET 2 is supplied from a pulse generator 4 a pulse signal $\phi$ having an amplitude of $E_2$ volt. The drain electrode of the IG-FET 2 is connected to an output terminal 5, the drain electrode of an N channel type IG-FET 6, and one electrode of a capacitor 7. Thus, a first conductive path is formed from the terminal 1 to the terminal 5 through the P channel between the source and drain of the IG-FET 2. A stray capacitance such as gate capacitance, wiring-ground capacitance, junction capacitance may be used for the capacitor 7.

The other electrode of the capacitor 7 and the substrate electrode of the IG-FET 6 are both grounded. The gate electrode of the IG-FET 6 is connected to an input terminal 8 supplied with a specified DC voltage $E_1$ (for example, 1.5 volts) while the source electrode is connected to a reference voltage input terminal 9. The reference voltage input terminal 9 is connected to the output terminal of an OR gate circuit 10 while the input terminals of the OR gate circuit 10 are supplied respectively with an output from a pulse generator 11 for generating a second pulse signal $\phi'$ substantially synchronized with said first pulse signal and a low amplitude logic signal VI from a preceding stage logic circuit 12. Thus, a second conductive path is created from the terminal 5 to the terminal 9 through the channel between the source and drain of the N channel type IG-FET 6, and a complementary IG-FET circuit is constituted by the P channel type IG-FET 2 and the N channel type IG-FET 6.

Figure 2:
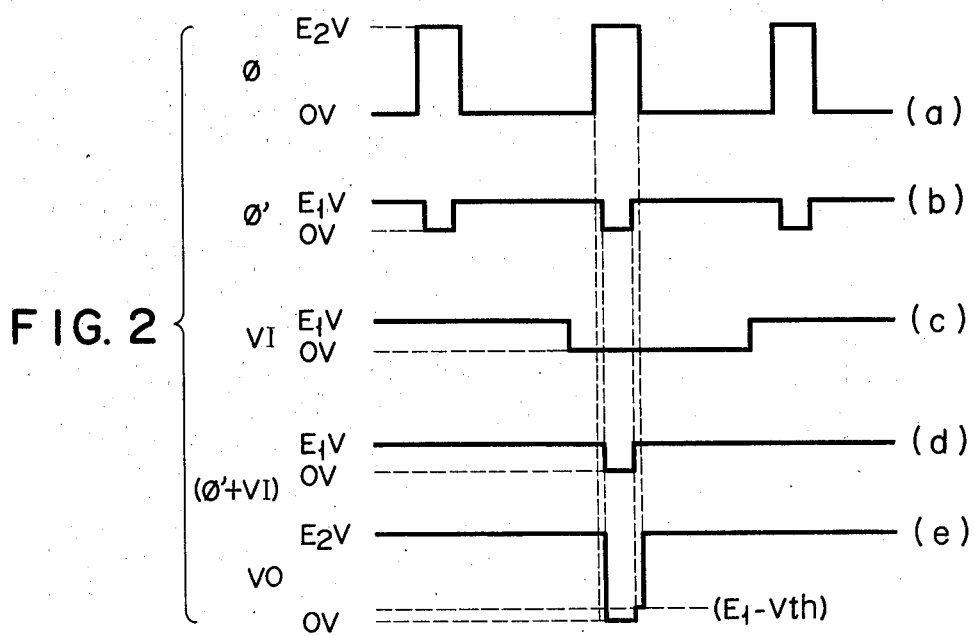
FIG. 2 illustrates signal waveforms for explaining the operation of the circuit of FIG. 1.

Hereinafter, the operation of the circuit illustrated in FIG. 1 is described with reference to FIG. 2. Note that, though the following explanation is made using a positive logic, it can similarly be made using a negative logic. The output $\phi$ from the pulse generator 4 is a pulse signal having a specified cyclical period and width and having two voltage values of 0 volt and $+E_2$ volt, as illustrated in FIG. 2(a). When the pulse signal $\phi$ is 0 volt, the IG-FET 2 is rendered conductive whereas when the pulse signal $\phi$ is $E_2$ volt, the IG-FET 2 is rendered nonconductive. When the IG-FET 2 is rendered conductive, the capacitor 7 is charged to $+E_2$ volt to cause an output of $+E_2$ volt to appear at the output terminal 5.

The pulse signal $\phi'$ from the pulse generator 11 is a pulse signal which is opposite in polarity to the pulse signal $\phi$ and slightly smaller in width than the pulse signal $\phi$ and has two voltage values of 0 volt and $E_1$ volt, as illustrated in FIG. 2(b). This voltage of $E_1$ volt has the same level of, for example, 1.5 volts as the power source voltage of the preceding stage-low voltage logic circuit 12. The low voltage logic signal VI from the preceding logic circuit 12 is a signal which is 0 volt only during the period in which the level shifting should be effected, and which $+E_1$ volt during other periods than this level shifting period, as illustrated in FIG. 2(c). Accordingly, the output signal from the OR gate circuit 10 supplied with the signals $\phi'$ and VI is a signal which is 0 volt only during that portion of said level shifting period in which the pulse signal $\phi'$ is 0 volt, and which is $+E_1$ volt during other periods than this period portion. Such signal $(\phi' + VI)$ is supplied to the input terminal 9. Since the specified voltage of $E_1$ is always applied to the gate electrode of the N channel IG-FET 6, the IG-FET 6 is rendered conductive only when the voltage applied to the terminal 9 is 0 volt and the drain voltage of the IG-FET 6 is $+E_2$ volt. This condition is illustrated in FIG. 2(e). When the IG-FET 6 is rendered conductive, the capacitor 7 charged to $+E_2$ volt is discharged through the second conductive path including the source and drain of the IG-FET 6, so that the potential of the output terminal 5 is reduced to 0 volt.

When the output signal $(\phi' + VI)$ from the OR gate circuit 10 is shifted to $+E$ volt with the pulse signal $\phi$ remaining to have a voltage of $+E_2$ volt, the IG-FET 2 is rendered nonconductive while the IG-FET 6 has a source electrode at the side of the output terminal 5 and a drain electrode at the side of the terminal 9. Namely, when the threshold voltage of the IG-FET 6 is set at Vth, the capacitor 7 is charged to $(E_1 - Vth)$ volt. Since $E_2 > E_1 > (E_1 - Vth)$ and yet it is considered that $(E_1 - Vth) \approx 0$, the $(E_1 - Vth)$ can be substantially regarded as a reference voltage. Next, when the signal $\phi$ is shifted to 0 volt with the signal $(\phi' + VI)$ remaining to have a voltage of $+E_1$ volt, the IG-FET 6 is turned OFF and the IG-FET 2 is turned ON, which causes the capacitor 7 to be again charged to $E_2$ volt as illustrated in FIG. 2(e). Thereafter, a similar operation is repeatedly carried out.

Accordingly, when the low voltage logic signal VI is 0 volt until the pulse signal $\phi$ becomes 0 volt after the pulse signal $\phi'$ has become 0 volt, the output signal 01 has substantially the reference voltage level and, during the remaining period, has the high voltage level of $E_2$ volt.

Since, in the circuit illustrated in FIG. 1, no DC current flows across the terminals 1 and 9 at any time when the operation of this circuit is carried out, no consideration has to be given, at the stage of design, to the impedance values between the terminals 1 and 5 and the terminals 5 and 9. Accordingly, the dimensions of the IG-FET's 2 and 6 can be made small and the circuit construction can be simplified with the result that the design and manufacture for conversion into an integrated circuit can be facilitated.

In the embodiment of FIG. 1, the first and second conductive paths between the terminals 1 and 5 and between the terminals 5 and 9 are constituted by the IG-FET 2 alone and the IG-FET 6 alone, respectively. Generally, however, the first and second paths have only to be formed using such circuit arrangement as is turned ON and OFF in synchronization with the respective ON and OFF operations of the IG-FET's 2 and 6. This is hereinafter described in detail by reference to FIG. 3 and the rest. In the following description, the mutually corresponding parts and sections are denoted by the same reference numerals.

Figure 3:
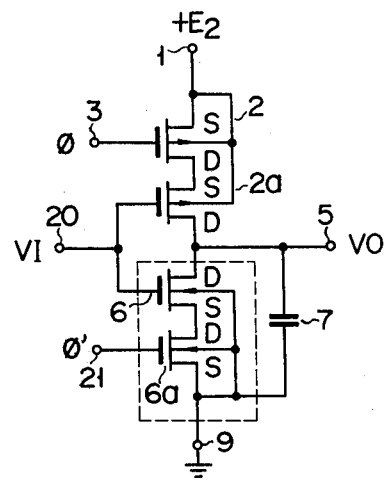
FIG. 3 is a circuit diagram illustrating a level shifting circuit according to another embodiment of the invention.

In FIG. 3, an IG-FET 2 and an IG-FET 2a are connected in series between terminals 1 and 5, and their respective substrates are connected to the terminal 1. Further, an IG-FET 6 and an IG-FET 6a are connected in series between the terminal 5 and a terminal 9, and their respective substrates are connected to a ground. The terminal 9 is grounded. The drain electrodes of the IG-FET's 2a and 6 are connected to each other and the gate electrodes thereof are also connected to each other. A connection point between the gates of the IG-FET's 2a and 6 is connected to a terminal 20, which is supplied with a low voltage logic signal VI from said preceding stage low voltage logic circuit. To the gate of the IG-FET 6a is connected a terminal 21, which is supplied with a pulse signal $\phi'$. In the case of FIG. 3, the first conductive path between the terminals 1 and 5 is so formed as to include the IG-FET's 2 and 2a, while the second conductive path between the terminals 5 and 9 is so formed as to include the IG-FET's 6 and 6a.

Figure 4:
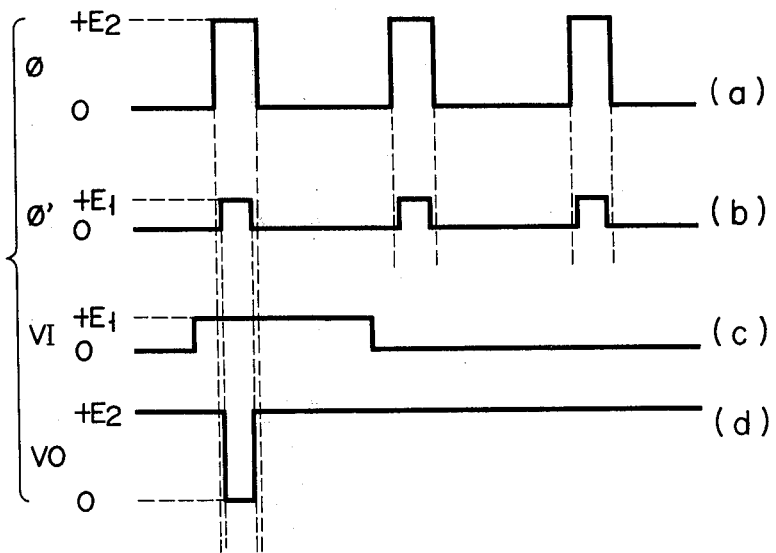
FIG. 4 illustrates signal waveforms for explaining the operation of the circuit of FIG. 3.

Hereinafter, the operation of the circuit illustrated in FIG. 3 is described with reference to FIG. 4. When a pulse signal $\phi$ is 0 volt, the IG-FET 2 is turned ON, while when the pulse signal $\phi$ is 0 volt, the pulse signal $\phi'$ is also 0 volt. Therefore, the IG-FET 6a is in an OFF state. When it is assumed that the threshold voltage of the IG-FET 2a have a level of Vth, the logic levels of the low voltage logic signal VI are a reference voltage level $E_0$ and a first voltage level $E_1$ and yet the relation of $|E_1 - E_0| < |E_2 - E_0| - |Vth|$ generally holds true. For this reason, the IG-FET $2a$ is turned ON irrespective of the voltage level of the input signal VI. Accordingly, a capacitor 7 is charged to $+E_2$ volt.

Even when the signal $\phi$ has become $+E_2$ volt as illustrated in FIG. $4(a)$ to cause the IG-FET 2 to be turned OFF, the capacitor 7 remains to have a voltage of $+E_2$ volt since the IG-FET $6a$ is in an OFF state while the signal $\phi'$ has 0 volt. When the level of the signal $\phi'$ is shifted to $+E_1$ volt as illustrated in FIG. $4(b)$, the IG-FET $6a$ is turned ON. If, at this time, the level of the input signal VI is 0 volt, the IG-FET 6 will be in an OFF state and therefore the capacitor 7 will remain to have a voltage of $+E_2$ volt. But if, at that time, the level of the input signal VI is $+E$ volt as illustrated in FIG. $4(c)$, the IG-FET 6 will be turned ON with the result that the capacitor 7 is discharged as illustrated in FIG. $4(d)$ to cause the potential at the output terminal 5 to become zero.

When the signal $\phi'$ is shifted to 0 volt, the IG-FET $6a$ is turned OFF and therefore the terminal 21 remains to have a voltage of 0 volt. When, at this time, the signal $\phi$ becomes 0 volt, the IG-FET 2 is again turned ON to charge the capacitor 7 to $+E_2$ volt, so that the output terminal 5 has a voltage of $+E_2$ volt as illustrated in FIG. $4(d)$. In this way, the input signal VI having two levels — 0 volt and $E_1$ volt is level-shifted to the output signal $V_0$ having two levels — 0 volt and $+E_2$ volt.

In the foregoing description, the higher level of the signal $\phi'$ was specifically set at $+E_1$ volt, but this voltage level has only to be high enough to render the IG-FET $6a$ conductive, that is, higher than the threshold voltage of the IG-FET $6a$. Further, the pulse width, phase and cyclic period of the pulse signal $\phi'$ may be so determined that the "ON" period of the IG-FET $6a$ falls within the term during which the signal $\phi$ is $+E_2$ and yet the IG-FET 2 is "OFF." Accordingly, the signals $\phi$ and $\phi'$ may be the same in pulse width and phase and be different in respect of cyclic period only.

Further, the source potential of the IG-FET 2 does not have to be $+E_2$ volt at all times. For example, such a pulse as becomes $+E_2$ volt when the signal $\phi$ has a zero level may be applied to the terminal 1. Further, such a pulse as has a reference voltage of $E_0$ volt when the IG-FET 6 is "ON" may be applied to the terminal 9, without grounding the same.

Figure 5:
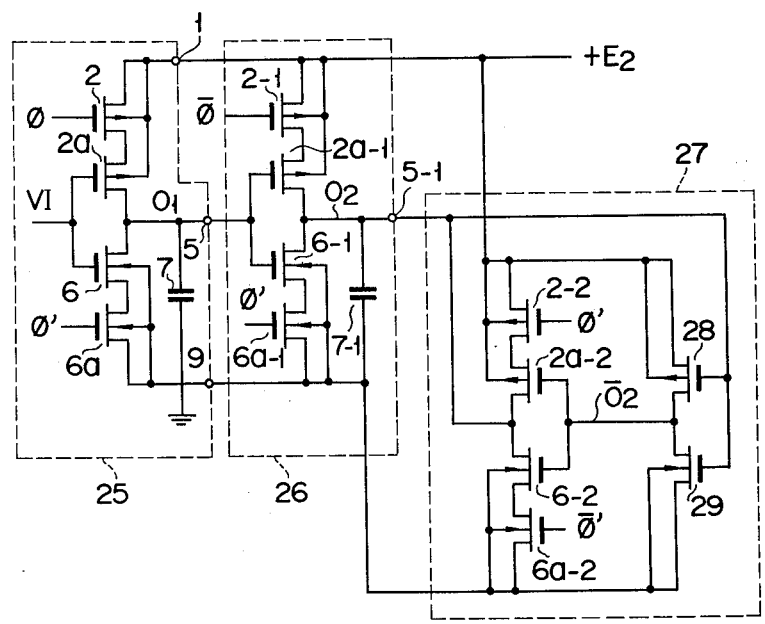
FIG. 5 is a circuit arrangement prepared by adding a storage circuit and a stabilizer circuit to the circuit of FIG. 3.
Figure 6:
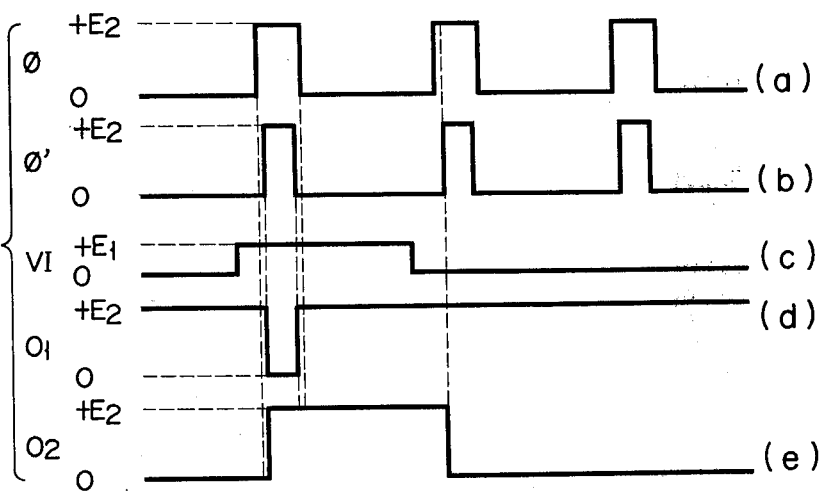
FIG. 6 illustrates signal waveforms for explaining the operation of the circuit arrangement of FIG. 5.

In FIG. 5, the level shifting circuit of FIG. 3 is enclosed, as a whole, by a dotted line indicated by a reference numeral 25. A block circuit 26 is a storage circuit for storing therein the output signal $O_1$ of the level shifting circuit 25, while a block circuit 27 is a circuit for stabilizing the output signal $O_2$ of the storage circuit 26.

The storage circuit 26 is constructed such that two P channel type IG-FET's 2-1, $2a$-1, two N channel type IG-FET's 6-1, $6a$-1 and a capacitor 7-1 are mutually connected similarly to the level shifting circuit of FIG. 3. The gate of the IG-FET 2-1 is supplied with a pulse signal $\overline{\phi'}$ opposite in polarity to the pulse signal $\phi'$, while a connection point between the gates of the IG-FET's $2a$-1, 6-1 is supplied with an output signal from the level shifting circuit 25 through the terminal 5. The gate of the IG-FET $6a$-1 is supplied with the pulse signal $\phi'$.

When the level of the output signal $O_1$ appearing at the output terminal 5 of the level shifting circuit 25 is decreased to 0 volt as illustrated in FIG. $6(d)$, both the signals $\phi$ and $\phi'$ have, respectively, higher levels $E_2$ and $E_1$ as explained with reference to FIGS. 3 and 4 (see FIGS. $6(a)$ and $6(b)$). Since, accordingly, the signal $\overline{\phi'}$ applied to the gate of the IG-FET 2-1 has 0 volt, the IG-FET's 2-1, $2a$-1 are "ON," the IG-FET 6-1 is "OFF," and the IG-FET $6a$-1 is "ON." Namely, as illustrated in FIGS. $6(d)$ and $6(e)$, simultaneously with the time when the output signal $O_1$ is decreased to 0 volt, the output signal $O_2$ is increased to $+E_2$ volt due to the capacitor 7-1 being charged to $+E_2$ volt. Thus, the output signal $O_1$ of the level shifting circuit 25 is stored as the charged voltage level of the capacitor 7-1. This stored level is maintained until the charge of the capacitor 7-1 is discharged passing through the IG-FET's 6-1, $6a$-1, due to the pulse signal $\phi'$ becoming a higher level ($+E_2$ volt) after the level of the low voltage logic signal VI of FIG. $6(c)$ has become zero.

The output signal $O_2$ of the storage circuit 26 is supplied through the terminal 5-1 to a connection point between the drains of IG-FET's $2a$-2, 6-2 of the stabilizer circuit 27 and to a connection point between the gates of IG-FET's 28, 29. the source electrode of the IG-FET $2a$-2 is connected through the P channel type IG-FET 2-2 to a high voltage source $+E_2$, while the source electrode of the IG-FET 6-2 is grounded through an IG-FET $6a$-2. A connection point between the gates of the IG-FET's $2a$-2, 6-2 is connected to a connection point between the drains of the IG-FET's 28, 29. The gate of the IG-FET 2-2 is supplied with the pulse signal $\phi'$, while the gate of the IG-FET $6a$-2 is supplied with the opposite polarity-pulse signal $\overline{\phi'}$.

Namely, when the level of the output signal $O_2$ at the output terminal 5-1 of the storage circuit 26 is changed from 0 volt to $+E_2$ volt as illustrated in FIG. $6(e)$, the IG-FET 2-2 is turned OFF and the IG-FET $6a$-2 ON because, at this time, the signal $\phi'$ also has a voltage of $+E_2$ volt. Since, at this time, the IG-FET 28 is "OFF" and the IG-FET 29 is "ON," the gate potentials of the IG-FET's $2a$-2, 6-2 become zero volt to cause the IG-FET 6-2 to be also turned ON.

Next, even when the signal $\phi'$ is shifted to 0 volt with the output signal $O_2$ remaining to have a voltage of $+E_2$ volt, the operative condition of the IG-FET's 28, 29 presents no change, and therefore an output signal $\overline{O_2}$ remains to have a voltage of 0 volt. Next, when the signal $O_2$ is shifted to 0 volt, the IG-FET 28 is turned ON, the IG-FET 29 OFF, and the IG-FET's 6-2, $6a$-2 OFF. As a result, the signal $\overline{O_2}$ is increased to the same potential as the high voltage source $+E_2$. Thus, the output $O_2$ of the strage circuit 26 is stably maintained by the stabilizer circuit 27.

Note here that the output signal $O_1$ may be supplied to the storage circuit 26 in such a manner that it is rendered opposite in polarity through providing an inverter between the level shifting circuit 25 and the storage circuit 26 of FIG. 5 and that arrangement may be so made, by providing a gate circuit supplied with the output signal $O_1$ of the level shifting circuit 25 and another logic signal, for example, the output signal of another level shifting circuit using pulses $\phi$ and $\phi'$ each of which has two levels — for example, 0 volt and $+E_2$ volt, that the output of this gate circuit is stored in the storage circuit 26.

Figure 7:
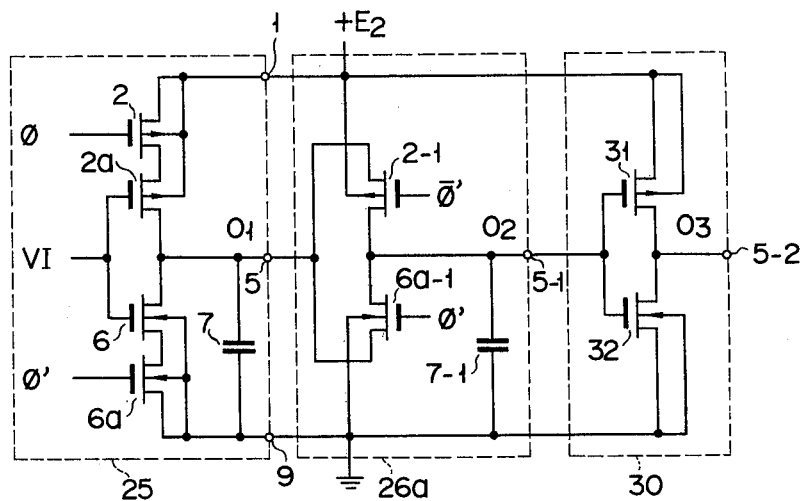
FIG. 7 is a modification of the circuit arrangement of FIG. 5.

In FIG. 7 illustrating a modification of the circuit of FIG. 5, the output signal $O_1$ of a level shifting circuit 25 is connected to a connection point between the respective source electrodes of IG-FET's 2-1, $6a$-1 in a storage circuit 26a. The substrate of IG-FET 2-1 is connected to a power source $+E_2$, while the substrate of the IG-FET 6a-1 is grounded. A connection point between the respective drain electrodes of the IG-FET's 2-1, 6a-1 is connected to an output terminal 5-1 and to one terminal of a capacitor 7-1, the other terminal of which is grounded. The gate of the IG-FET 6a-1 is supplied with the output signal $\phi'$, while the gate of the IG-FET 2-1 is supplied with the opposite polarity-pulse signal $\overline{\phi'}$.

Figure 8:
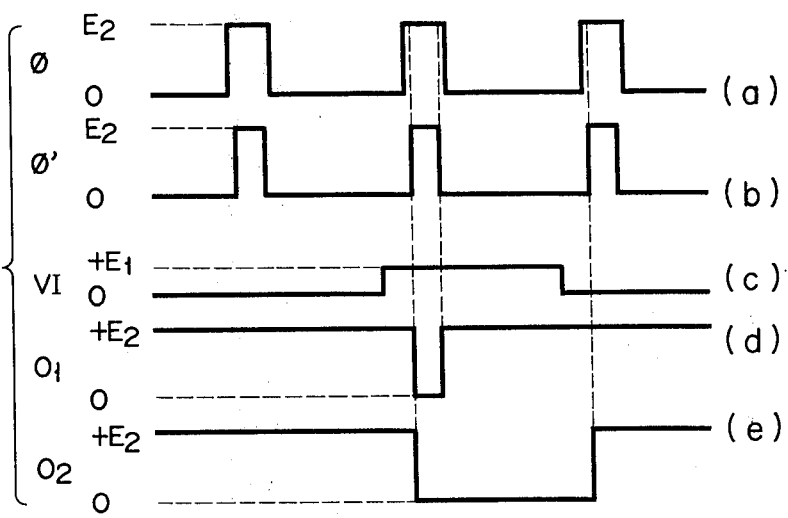
FIG. 8 illustrates signal waveforms for explaining the operation of the modified circuit of FIG. 7.

Namely, when the output signal $\phi'$ is shifted to $+E_2$ volt (see FIGS. 8(b) and 8(c)) during the period in which the low voltage logic signal VI has a higher level ($+E_1$ volt), the output signal $O_1$ of the level shifting circuit 25 is reduced to 0 volt as illustrated in FIG. 8(d). As a result, the IG-FET 2-1 is turned OFF and the IG-FET 6a-1 ON to cause the capacitor 7-1 to be discharged with the result that the output signal $O_2$ of the output terminal 5-1 is decreased to 0 volt. The 0 volt state of this output $O_2$ is maintained until the pulse signal $\phi'$ is next shifted from 0 volt to $+E_2$ volt. When the signal $\phi'$ is shifted to $+E_2$ volt, the IG-FET 2-1 is turned ON and the IG-FET 6a-1 OFF to cause the capacitor 7-1 to be again charged to $+E_2$ volt.

The output $O_2$ of the storage circuit 26a is inverted, in terms of polarity, as required, by operation of an inverter 30 and thus is converted into an output $O_3$. The inverter 30 is constructed such that a P channel type IG-FET 31 and an N channel type IG-FET 32 are connected in series between a power source $+E_2$ and ground, and a connection point between the gates of the IG-FET's 31, 32 is supplied with the preceding stage-output $O_2$. The output $O_3$ of the inverter 30 is drawn out from a terminal 5-2 through a connection point between the drains of the IG-FET's 31, 32. The substrates of the IG-FET's 31, 32 are connected to the power source $+E_2$ and to a ground, respectively.

Figure 9:
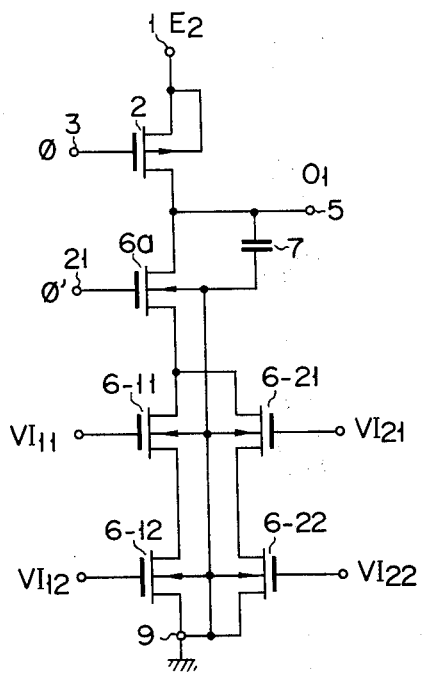
FIG. 9 is a modification of the circuit of FIG. 3.

FIG. 9 illustrates a modification of the circuit of FIG. 3. The first conductive path is constituted by an IG-FET 2 only, while the second conductive path is constituted by a parallel-series logic circuit including an IG-FET 6a and four IG-FET's 6-11, 6-12, 6-21 and 6-22 connected in parallel-series to the IG-FET 6a. The gate electrodes of the four IG-FET's 6-11, 6-12, 6-21 and 6-22 are supplied, respectively, with four logic signals VI 11, VI 12, VI 21 and VI 22 in replacement of the logic signal VI. The ground side-terminal of the capacitor 7 is connected, together with the respective substrate electrodes of the IG-FET's 6-11, 6-12, 6-21 and 6-22, to a terminal 9. The gate electrode of the IG-FET 2 is supplied with the signal $\phi$, while the gate electrode of the IG-FET 6a is supplied with the signal $\overline{\phi}$.

In FIG. 9, in the case of using a positive logic, between the logic signals VI and VI 11 to VI 22 a relation expressed by the logical formula: VI=VI 11 . VI 12 + VI 21 . VI 22 holds true. Namely, if, in case the signal $\phi'$ has the higher level and the IG-FET 6a is resultantly turned ON, a logical product of the signals VI 11 and VI 12 is obtained, the second conductive path will be constituted by the IG-FET's 6a, 6-11 and 6-12, while if, in such a case, a logical product of the signals VI 21 and VI 22 is obtained, the second conductive path will be constituted by the IG-FET's 6a, 6-21 and 6-22. Whichever logical product may be obtained, the charge of the capacitor 7 is discharged through the IG-FET's 6a, 6-11 and 6-12 or through the IG-FET's 6a, 6-21 and 6-22.

In the modification of FIG. 9, arrangement may be so made that a signal $\overline{\phi}$ subjected to inversion of the signal $\phi$ illustrated in FIG. 4(a) is applied to a terminal 1. Further, as a signal applied to a terminal 21 the signal $\phi$ having a high voltage of $+E_2$ volt, in lieu of the signal $\phi$, may be applied thereto. Further, where it is desired to operate the logic circuit of FIG. 9 using a negative logic, there has only to be applied thereto such a signal as satisfies the logical formula; VI =(VI 11 + VI 12) . (VI 21 + VI 22).

Figure 10:
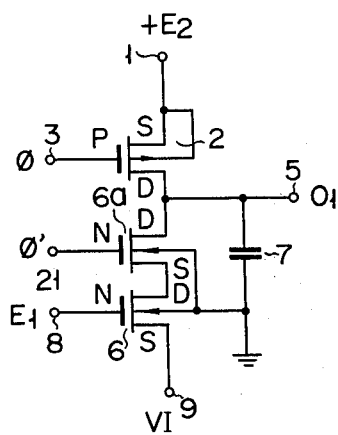
FIG. 10 is a circuit diagram illustrating a level shifting circuit according to another embodiment of the invention.
Figure 11:
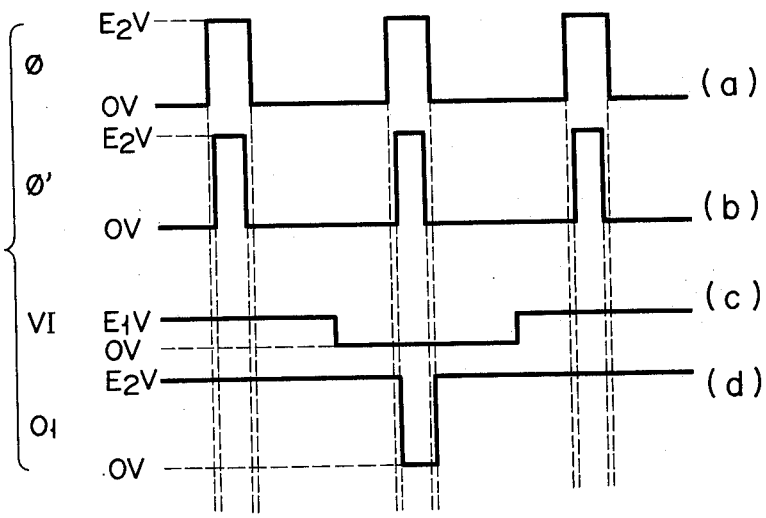
FIG. 11 illustrates signal waveforms for explaining the operation of the circuit of FIG. 10.

In an embodiment illustrated in FIG. 10, the first conductive path between terminals 1 and 9 is constituted by one P channel type IG-FET 2, to the gate terminal 3 of which is applied a signal $\phi$ illustrated in FIG. 11 (a). On the other hand, the second conductive path between a terminal 5 and the terminal 9 is constituted by two series-connected N channel type IG-FET's 6, 6a, to the respective gate terminals 8, 21 of which are applied a constant voltage $E_1$ and a pulse signal $\phi'$ illustrated in FIG. 11(b), respectively. The substrate of the IG-FET 2 is connected to a power source $+E_2$, while the substrates of the IG-FET's 6, 6a are grounded. A capacitor 7 is connected between the output terminal 5 and a ground.

Hereinafter, the operation of the circuit illustrated in FIG. 10 is described with reference to FIG. 11. When the signal $\phi$ has a voltage of 0 volt, the IG-FET 2 is "ON" and the signal $\phi'$ also has a voltage of 0 volt, so that the IG-FET 6a is "OFF." Though, accordingly, the second conductive path is cut off by the IG-FET 6a, the first conductive path is created with the result that the capacitor 7 is charged to $+E_2$ volt.

Next when the voltage level of the signal $\phi$ is shifted to the higher level, the IG-FET 2 is turned OFF. But so long as the signal $\phi'$ has the lower level, the IG-FET 6a remains "OFF." Therefore, the capacitor 7 remains to have a voltage of $+E_2$ volt.

Next, when the signal $\phi'$ is shifted to the higher level ($+E_2$ volt), the IG-FET 2 is turned OFF and the IG-FET 6a is turned ON. If, at this time, the logic signal VI has the higher level ($E_1$ volt) as illustrated in FIG. 11(c), the gate and source of the IG-FET 6 will have the same potential, so that the IG-FET 6 is "OFF" and the capacitor 7 therefore remains to have a voltage of $+E_2$ volt. On the other hand, when the logic signal VI has a voltage of 0 volt, the IG-FET 6 is turned ON with the result that the capacitor 7 is discharged to cause the output $O_1$ to be decreased to 0 volt as illustrated in FIG. 11(d).

Next, when the signal $\phi'$ is shifted to 0 volt, the IG-FET 6a is turned OFF. Since, at this time, however, the signal $\phi$ remains to have the higher level, the IG-FET 2 is "OFF" and the output $O_1$ therefore remains to have 0 volt. When the signal $\phi$ is shifted again to the lower level, the above-mentioned operation is repeatedly performed.

In this way, in accordance with the logic signal VI having two logic levels — the reference voltage $E_0$ (0 volt here in this specification) and $E_1$ volt, there is obtained the output signal $O_1$ having two levels of 0 volt and $E_2$ volt thus to complete a desired level shifting operation. Note that the sequential connection order of the IG-FET's 6a and 6 may be reversed, that is, the IG-FET 6a may be connected at the side of the terminal 9. Further, if the higher level of the signal $\phi'$ is specifically set at $E_1$ volt, the IG-FET 6 can be omitted. Further, regardless of the potential level of the signal $\phi'$ a logic signal VI-1 having two levels - 0 volt and $E_1$ volt may be given as the gate signal of the IG-FET 6. In this case, while the logic signal VI-1 has the higher level ($E_1$ volt), the output $O_1$ is given the reference voltage $E_0$ of the signal VI, and, during the remaining period, the output $O_1$ has a voltage of $E_2$ volt. Namely, the output $O_1$ having a voltage level given by the logical formula: $(VI + \overline{VI + 1})$ is obtained.

Figure 12:
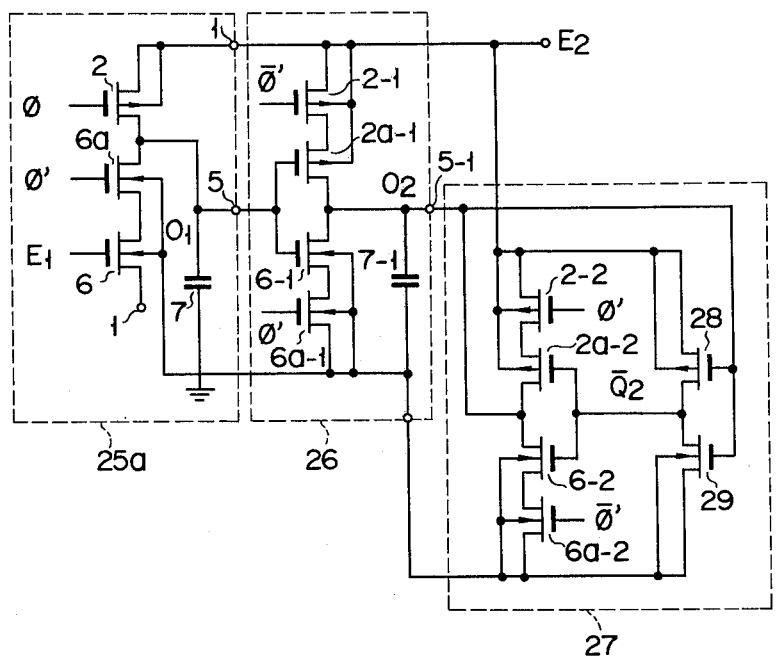
FIG. 12 is a circuit arrangement prepared by adding a storage circuit and a stabilizer circuit to the circuit of FIG. 10.

FIG. 12 illustrates a circuit prepared by adding to the level shifting circuit of FIG. 10 a storage circuit 26 and stabilizer circuit 27 as used in FIG. 5. The circuits 26, 27 have the same construction as in FIG. 5.

Figure 13:
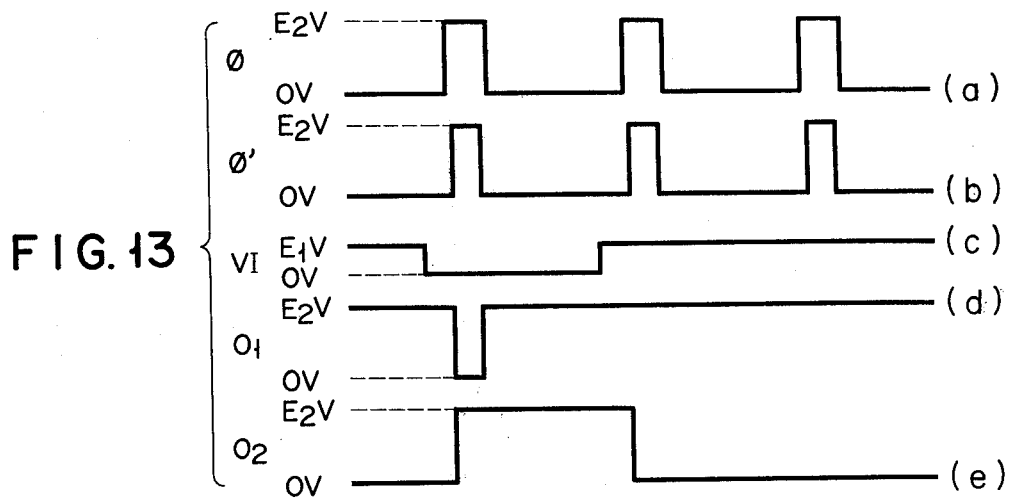
FIG. 13 illustrates signal waveforms for explaining the operation of the circuit arrangement of FIG. 12.

As illustrated in FIG. 13, when the signals $\phi$ and $\phi'$ respectively have the higher level, the storage circuit 26 acts as an inverter to cause a charge of the capacitor 7-1 between the output terminal 5-1 and ground of the storage circuit 26, so that the output $O_2$ of the storage circuit 26 is maintained to have a charge equal to that in the capacitor 7-1 until the signal $\phi'$ as the next strobe pulse signal comes to have the higher level. The stabilizer circuit 27 is cascade-connected to the storage circuit 26 and, when the signal $\phi'$ has the lower level, functions as a flip-flop circuit with the result that the output $O_2$ is stably maintained.

FIG. 14 illustrates a modification of the circuit illustrated in FIG. 12. In this modification, the level shifting circuit is composed of the P channel type IG-FET 2 constituting the first conductive path, the N channel IG-FET's 6a, 6-11 and 6-21 constituting the second conductive path, and the capacitor 7. The gate of the IG-FET 2 is supplied with the signal $\phi$ of FIG. 15(a), the gate of the IG-FET 6a is supplied with the signal $\phi'$ of FIG. 15(b), the gates of the IG-FET's 6-11, 6-21 are supplied with such two logic signals VI 2, VI 3 as satisfy with respect to the input logic signal VI illustrated in FIG. 15(d) the logical formula: $VI = VI\ 1 + \overline{VI\ 2 + VI\ 3}$ as obtained using a positive logic, and a connection point between the sources of the FET's 6-11, 6-21 is supplied with the logic signal VI. In the case of a negative logic the relation of $VI = VI\ 1 \cdot \overline{VI\ 2 \cdot VI\ 3}$ is established.

The output $O_1$ of the level shifting circuit as illustrated in FIG. 15(e) is supplied through the output terminal 5 to the storage circuit 26 constructed similarly to FIG. 12. In this storage circuit 26, the substrate electrodes of the IG-FET's 2-1, 2a-1 are connected to a power source having a voltage of $E_2$ volt or $E_4$ volt, the gate of the IG-FET 2-1 is supplied with the signal $\phi L$ subjected to inversion of a signal $\phi L$ illustrated in FIG. 15(c), and the source terminal of the IG-FET 2-1 is connected to a power source of $E_4$ volt. Further, the substrate electrodes of the IG-FET's 6-1, 6a-1 are connected to a power source having a voltage of 0 volt or $E_3$ volt, and the source electrode of the IG-FET 6a -1 is connected to a power source of $E_3$ volt. The gate of the IG-FET 6a -1 is supplied with the signal $\phi L$ of FIG. 15(c). Note here that among the voltages $E_1$, $E_2$, $E_3$ and $E_4$ there exist the relations of $OV < E_1 < E_2$ and $OV$ $E_3$ $E_4$ $E_2$. In accordance with the output $O_1$ of the level shifting circuit the output $O_2$ having the opposite polarity to the output $O_1$ appears at the output terminal 5-1.

The output $O_2$ is supplied to the stabilizer circuit 27 constructed similarly to FIG. 12. The substrate electrodes of the IG-FET's 2-2, 2a-2 and 28 are connected to the power source of $E_2$ or $E_4$ volt, while the substrate electrodes of the IG-FET's 6-2, 6a-2 and 29 are connected to the power source of O or $E_3$ volt. The source electrodes of the IG-FET's 2—2, 28 are connected to the power source of $E_4$ volt, while the source electrodes of the IG-FET's 6a-2, 29 are connected to the power source of $E_3$ volt. Note that as the output of the stabilizer circuit 27 the signal $\overline{O_2}$ subjected to inversion of the signal $O_2$ can be drawn out from a connection point between the drain electrodes of the IG-FET's 28, 29, as required.

Figure 16:
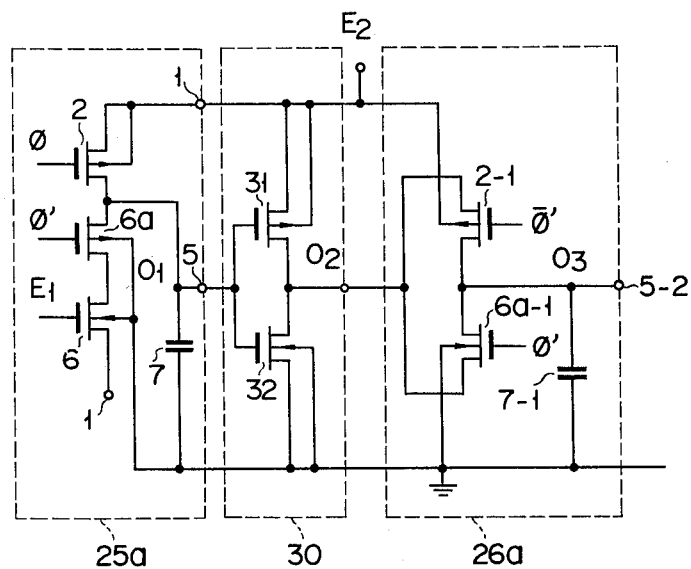
FIG. 16 is another modification of the circuit arrangement of FIG. 12.
Figure 17:
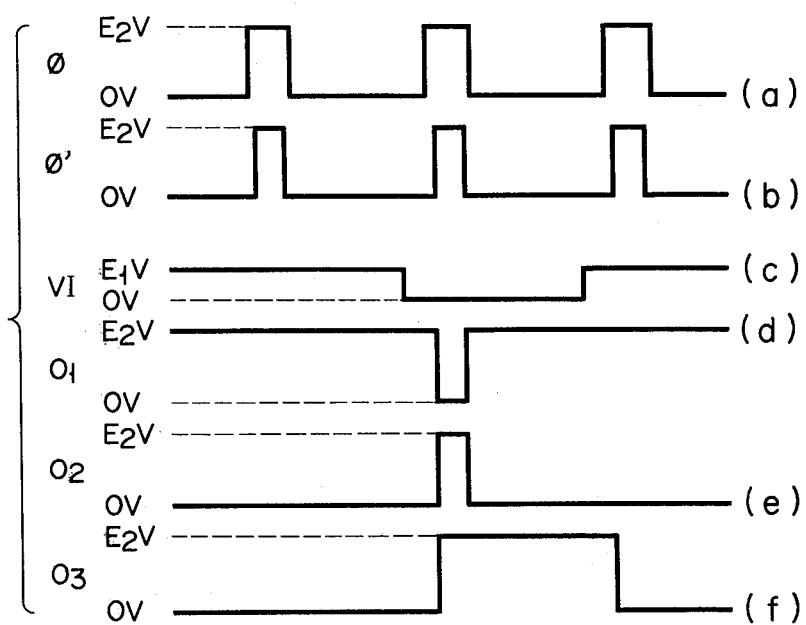
FIG. 17 illustrates signal waveforms for explaining the operation of the modified circuit arrangement of FIG. 16.

In FIG. 16, the output $O_1$ of the level shifting circuit 25a as illustrated in FIG. 17(d) is subjected by an inverter 30 to polarity-inversion to become an output as illustrated in FIG. 17(e). The output $O_2$ of the inverter 30 is then sent to the storage circuit 26a. The storage circuit 26a stores, as illustrated in FIG. 17(f), the output $O_1$ of the level shifting circuit 25 as a signal $O_3$ under the state wherein the capacitor 7-1 is charged when the signals $\phi$, $\phi'$ have the higher level.

Figure 18:
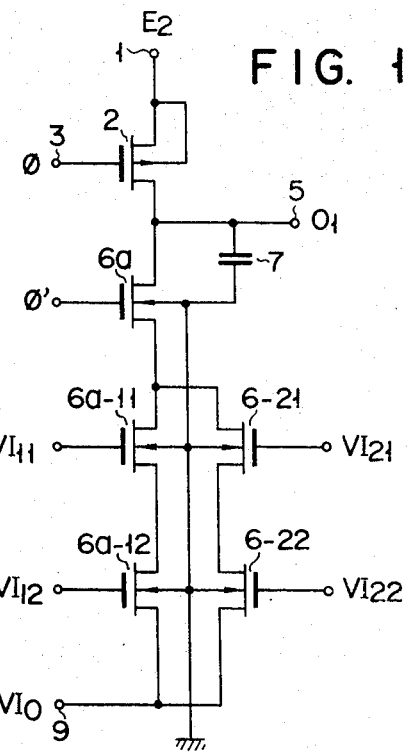
FIG. 18 is a modification of the circuit of FIG. 10.

FIG. 18 is a circuit diagram illustrating a modification of the circuit illustrated in FIG. 10. In this modification, the first conductive path is constituted by the IG-FET 2, while the second conductive path is constituted by a series circuit composed of the IG-FET 6a and a series-parallel circuit consisting of the IG-FET's 6-11, 6-12, 6-21 and 6-22. The source electrodes of the IG-FET's 6-12, 6-22 are connected to the terminal 9 supplied with the input logic signal VI 0. The gate electrode of the IG-FET 2 is supplied with the signal $\phi$, the gate electrode of the IG-FET 6a is supplied with the signal $\phi'$, and the gate electrodes of the IG-FET's 6-11, 6-12, 6-21 and 6-22 are supplied with the logic signals VI 11, VI 12, VI 21 and VI 22, respectively. If there is established between the logic signal VI supplied to the terminal 9 of FIG. 10 and the five logic signals VI 0, VI 11, VI 12, VI 21 and VI 22 the logical formula: $VI = VI\ 0 + \overline{VI\ 11 \cdot VI\ 12} + \overline{VI\ 21 \cdot VI\ 22}$ as obtained using a positive logic, the circuit of FIG. 18 will operate as explained with reference to FIGS. 10 and 11. Note that , in the case of a negative logic, the logical formula: $VI = VI\ 0 \cdot \overline{(VI\ 11 + VI\ 12) \cdot (VI\ 21 + VI\ 22)}$ has only to hold true.

Figure 19:
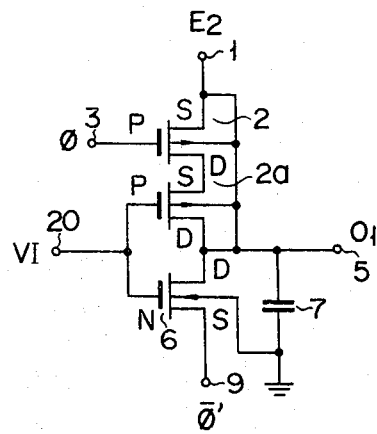
FIG. 19 is a circuit diagram illustrating a level shifting circuit according to another embodiment of the invention.

In an embodiment of FIG. 19, the first conductive path between the terminals 1 and 5 is constituted by the series-connected P channel type IG-FET's 2, 2a. The substrates of the IG-FET's 2, 2a are connected to the terminal 1. The gate terminal 3 of the IG-FET 2 is supplied with the clock signal $\phi$ as illustrated in FIG. 20(a). On the other hand, the second conductive path between the terminals 5 and 9 is constituted by one N channel type IG-FET 6. The gate of the IG-FET 6 is connected, together with the gate of the IG-FET 2a, to a terminal 20 supplied with the low voltage logic signal VI of FIG. 20(c), while the substrate of the IG-FET 6 is grounded. The capacitor 7 is connected between the output terminal 5 and a ground. The source electrode of the IG-FET 6 is supplied with the signal $\overline{\phi'}$ of FIG. 20(b) having the opposite polarity to the signal $\phi$ and a zero volt period which is slightly shorter than the higher level period of the signal $\phi$. Namely, the signal $\phi$ has the higher level at least during the lower level period of the signal $\overline{\phi'}$.

Figure 20:
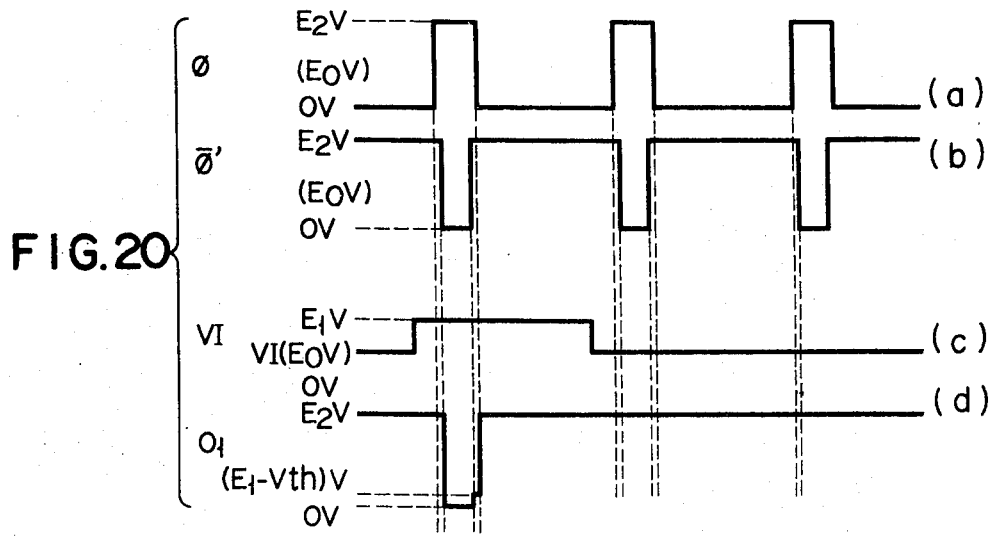
FIG. 20 illustrates signal waveforms for explaining the operation of the circuit of FIG. 19.

In FIGS. 19 and 20, when the signal $\phi$ has the lower level, the IG-FET 2 is "ON." The low voltage signal VI has two levels $-E_1$ volt and $E_0$ volt, and generally the relation of $|E_1 - E_o| < |E_2 - E_o| - |V_{th}|$ holds true. Therefore, the IG-FET 2a is turned ON irrespective of the level of the signal VI. At this time, on the other hand, the signal $\overline{\phi'}$ has a higher level of $E_2$ volt, and therefore the capacitor 7 is charged to $E_2$ volt through the first conductive path constituted by the IG-FET's 2, 2a. Even where the higher level of the pulse signal $\overline{\phi'}$ is not $E_2$ volt but $E_1$ volt ($E_2 > E_1$), the gate input VI of the IG-FET 6 is 0 volt or $E_1$ volt and is the same in level as the source voltage of the IG-FET 6, namely, lower by an extent equal to the level of the threshold voltage. As a result, the IG-FET 6 is "OFF" and the second conductive path is also "OFF."

Next, even where the signal $\phi$ is shifted to the higher level with the result that the IG-FET 2 is turned "ON", the IG-FET 6 remains "OFF" so long as the pulse signal $\overline{\phi'}$ has the higher level. Accordingly, the capacitor 7 remains charged to $E_2$ volt.

Next, if the input logic signal VI has the lower level when the pulse $\overline{\phi'}$ has been shifted to the lower level, i.e., the pulse $\phi'$ has been shifted to the higher level, the IG-FET 6 will become "OFF" to cause the capacitor 7 to remain charged. Conversely, if said input logic signal VI has the higher level at that time, the IG-FET 6 will become "ON" to cause the charge in the capacitor 7 to be discharged through the IG-FET 6, so that the potential of the output terminal 5 is decreased to 0 volt as illustrated in FIG. 20(d).

Next, where the signal $\overline{\phi'}$ is shifted to the higher level when the signal $\phi$ has the higher level, the output $O_1$ has the higher level since, when the logic signal VI has the lower level, the IG-FET 6 is "OFF." When, under the condition in which the logic signal VI has the higher level, the signal $\overline{\phi'}$ is shifted to the higher level, the IG-FET 6 has a source electrode at the side of the terminal 5 and a drain electrode at the side of the terminal 9 to present a source-follower state. For this reason, when the potential of the output terminal 5 is brought to a state in which it is lower by an extent equal to the level of the threshold voltage $V_{th}$ of the IG-FET 6 than the voltage $E_1$, that is, has a level of $(E_1 - V_{th})$, the IG-FET 6 becomes "OFF, " so that the capacitor 7 is charged to this voltage $(E_1 - V_{th})$ as illustrated in FIG. 20(d). Since $O \approx (E_1 - V_{th}) << E_2$, the potential of the output terminal 5 is substantially 0 volt. When, under this condition, the signal $\phi$ is shifted to 0 volt, the IG-FET's 2, 2a constituting the first conductive path are again turned ON to cause the capacitor 7 to be charged to $E_2$ volt with the result that the output $O_1$ has a voltage of $E_2$ volt as illustrated in FIG. 20(d). In this way, the level-shifting from $E_1$ volt to $E_2$ volt is carried out.

FIG. 21 illustrates a modification of the circuit illustrated in FIG. 19. In this modification, the first conductive path is constituted by the IG-FET 2, while the second conductive path is constituted by the series-parallel circuit consisting of the four IG-FET's 6-11, 6-12, 6-21 and 6-22. The source electrodes of the IG-FET's 6-12, 6-22 are connected to the terminal 9, while the substrate electrodes of the IG-FET's 6-11, 6-12, 6-21 and 6-22 are grunded. The gate terminal 3 of the IG-FET 2 is supplied with the signal $\phi$, the terminal 9 is supplied with the opposite polarity signal $\overline{\phi}$, from the signal $\phi'$, and the gate electrodes of the IG-FET's 6-11, 6-12, 6-21 and 6-22 are supplied with the logic signals VI 11, VI 12, VI 21 and VI 22. If, in this case, the four logic signals VI 11, VI 12, VI 21 and VI 22 have such a level as satisfies with respect to the logic signal VI illustrated in FIG. 20 (c) the logical formula: VI = VI 11 · VI 12 + VI 21 · VI 22 as obtained using a positive logic, the circuit of FIG. 21 operates as described with reference to FIGS. 19 and 20. Note that in the case of a negative logic the levels of the logic signals VI 11, VI 12, VI 21 and VI 22 have only to be so set as to meet the logical formula: VI = (VI 11 + VI 12) ·(VI 21 + VI 22).

FIG. 22 is a circuit prepared by adding the same storage circuit 26 and stabilizer circuit 27 as shown in FIGS. 5 and 12 to the level shifting circuit 25b of the embodiment shown in FIG. 19. In FIGS. 22 and 23, when the signals $\phi$, $\phi'$ have the higher level and yet the input logic signal VI also has the higher level, the storage circuit 26 subjects to polarity-inversion the lower level state of the output $O_1$ of the level shifting circuit 25b and stores the polarity-inverted output $O_1$ as the signal $O_2$ at the higher level state, as illustrated in FIG. 23(e). The stored voltage level of this signal $O_2$ is maintained until the signal $\phi'$ is next shifted to the higher level. The operation of the stabilizer circuit 27 is the same as in FIGS. 5 and 12.

FIG. 24 illustrates a circuit prepared from the cascade-connection of the same inverter 30 and storage circuit 26a in turn as illustrated in FIG. 16 to the level shifting circuit 25b. The inverter 30 subjects the output $O_1$ to polarity inversion to produce the output $O_2$ as illustrated in FIGS. 25(d) and 25(e), and supplies this output $O_2$ to the storage circuit 26a. Similarly to FIG. 16, the stored output $O_3$ as illustrated in FIG. 25(f) is obtained at the terminal 5-2 in accordance with the output $O_2$.

In an embodiment illustrated in FIG. 26, the first conductive path is constituted by the P channel type IG-FET 2 and the second conductive path by the N channel type IG-FET 6, as in the case of the embodiment shown in FIG. 1. The gate of the IG-FET 2 is supplied with the pulse $\phi$ of FIG. 27(a). The gate of the IG-FET 6 is supplied, from an AND circuit 40, with a logical product signal ($\phi'$·VI) (see FIG. 27(d)) of the pulse signal $\phi'$ of FIG. 27(b) and the low voltage logic signal VI of FIG. 27(c). The source electrode and substrate of the IG-FET 6 are connected, together with one terminal of the capacitor 7, to a grounding terminal 9.

In FIGS. 26 and 27, when both the logical product signal ($\phi'$·VI) and the pulse signal $\phi$ have the lower level, the IG-FET 2 is turned ON and the IG-FET 6 OFF. Accordingly, the capacitor 7 is charged to $+E_2$ volt and the output $O_1$ has a voltage of $E_2$ volt as illustrated in FIG. 27(e). When the signal $\phi$ only is shifted to the higher level, the IG-FET 2 is turned OFF with the result that the capacitor 7 remains charged to $E_2$ volt.

Further, when the signal ($\phi'$·VI) is increased to the higher level while the signal $\phi$ has the higher level, the IG-FET 6 is turned ON and the IG-FET 2 OFF, so that the capacitor 7 is discharged to cause the output $O_1$ to be decreased to the lower level.

Next, when the signal ($\phi'$·VI) is decreased to the lower level while the signal $\phi$ has the higher level, the IG-FET's 2, 6 are both turned OFF with the result that the output $O_1$ remains to have the lower level. When both the signal ($\phi'$·VI) and the signal $\phi$ are shifted to the lower level, the circuit condition is returned to a state wherein the IG-FET 2 is turned ON and the IG-FET 6 OFF. As a result, the capacitor 7 is charged to $E_2$ volt. Thereafter, the same operation is respectively carried out.

What is claimed is:

1. A level shifting circuit device comprising a first terminal connected to a high amplitude power source, an output terminal, a first conductive path formed between said first terminal and said output terminal which includes a first IG-FET of one conductive channel type whose first electrode is connected to said first terminal, means for applying a first pulse signal to said first IG-FET, a reference voltage input terminal, a second conductive path formed between said reference voltage input terminal and said output terminal so as to include a second IG-FET of the other conductive channel type, means for generating a second pulse signal of sepcified polarity substantially synchronized with said first pulse signal, and a circuit arrangement for rendering said second IG-FET conductive when said second pulse signal has coincided with a low amplitude logic signal from a logic circuit immediately preceding said level shifting circuit device, wherein only when said second pulse signal and said logic signal have coincided with each other, a reference voltage output is obtained; and except for said time a high amplitude output is obtained through said first conductive path.

2. A level shifting circuit device according to claim 1, wherein said first conductive path includes said first IG-FET whose source and drain electrodes are connected between said first terminal and said output terminal; said second conductive path includes said second IG-FET whose drain and source electrodes are connected between said output terminal and said reference voltage input terminal; and said circuit arrangement includes means for applying a specified voltage to the gate electrode of said second IG-FET, a gate circuit whose output terminal is connected to said reference voltage input terminal, and means for supplying said second pulse signal and said low amplitude logic signal to the input terminals of said gate circuit.

3. A level shifting circuit device according to claim 1, wherein said second conductive path further includes a fourth IG-FET of said other conductive channel type connected in series to said second IG-FET and between said output terminal and said reference voltage input terminal; and said circuit arrangement includes means for applying said low amplitude logic signal commonly to the gate electrodes of said third IG-FET and second IG-FET, means for applying said second pulse signal to the gate electrode of said fourth IG-FET, and means for grounding said reference voltage input terminal.

4. A level shifting circuit device according to claim 1, wherein said first conductive path includes said first IG-FET whose source and drain electrodes are connected between said first terminal and said output terminal; said second conductive path includes parallel-series logic circuit having a plurality of IG-FET's of said other conductive channel type connected in series between said output terminal and said reference voltage input terminal; and said circuit arrangement includes means for applying said second pulse signal to the gate electrode of said third IG-FET, means for applying first, second, third and fourth logic signals VI 11, VI 12, VI 21 and VI 22 to the gate electrodes of said plurality of IG-FET's, respectively, there being established between said low amplitude logic signals VI 11, VI 12, VI 21 and VI 22 and said logic signal VI a relation expressed by the logical formula: VI = VI 11 · VI 12 + VI 21 · VI 22, and said means for grounding said reference voltage input terminal.

5. A level shifting circuit device according to claim 3, further comprising at least one of a storage circuit for storing an output signal from said level shifting circuit device and a stabilizer circuit for stabilizing in terms of logic level an output from said storage circuit.

6. A level shifting circuit device according to claim 5, wherein said storage circuit includes a storage output terminal, fifth and sixth IG-FET's of said one conductive channel type connected in series between said storage output terminal and said first terminal, and seventh and eighth IG-FET's of said other conductive channel type connected in series between said storage output terminal and said reference voltage input terminal, the gate electrodes of said sixth and seventh IG-FET's being connected to said output terminal, the gate electrode of said fifth IG-FET being supplied with a signal having a polarity opposite to that of said second pulse signal, the gate electrode of said eighth IG-FET being supplied with said second pulse signal; and said stabilizer circuit includes ninth and tenth IG-FET's of said one conductive channel type connected in series between said first terminal and said storage output terminal, eleventh and twelfth IG-FET's of said other conductive channel type connected in series between said storage output terminal and said reference voltage input terminal, means for connecting commonly the gate electrodes of said tenth and eleventh IG-FET's, a thirteenth IG-FET of said one conductive channel type connected between said commonly connecting point and said first terminal, a fourteenth IG-FET of said other conductive channel type connected between said commonly connecting point and said reference voltage input terminal, means for connecting the substrate electrodes of said ninth and tenth IG-FET's to said first terminal, means for connecting the substrate electrodes of said eleventh and twelfth IG-FET's to said reference voltage input terminal, and means for connecting the gate terminals of said thirteenth and fourteenth IG-FET's to said storage output terminal.

7. A level shifting circuit device according to claim 5, in which said storage circuit includes a storage output terminal, a fifth IG-FET of said other conductive channel type which is connected between said storage output terminal and said output terminal and the substrate electrode of which is connected to said first terminal, a sixth IG-FET of said other conductive channel type which is connected between said storage output terminal and said output terminal and the substrate electrode of which is grounded, and a capacitor connected between said storage output terminal and a ground, the gate electrode of said fifth IG-FET being supplied with a signal having a polarity opposite to that of said second pulse signal, the gate electrode of said sixth IG-FET being supplied with said second pulse signal; and which further comprises an inverter composed of seventh and eighth IG-FET's for inverting the polarity of an output from said storage circuit.

8. A level shifting circuit device according to claim 1, wherein said first conductive path includes said first IG-FET connected between said first terminal and said output terminal; said second conductive path includes a third IG-FET of said other conductive channel type connected in series to said second IG-FET and between said output terminal and said reference voltage input terminal; and said circuit arrangement includes means for applying a specified voltage to the gate electrode of said second IG-FET, means for applying said second pulse signal to the gate electrode of said third IG-FET, and means for applying said logic signal to said reference voltage input terminal.

9. A level shifting circuit device according to claim 1, wherein said first conductive path includes said first IG-FET connected between said first terminal and said output terminal; said second conductive path includes parallel-series logic circuit having a plurality of IG-FET's of said other conductive channel type connected in series between said output terminal and said reference voltage input terminal; and said circuit arrangement includes means for applying said second pulse signal to the gate electrode of said third IG-FET and means for applying first, second, third, fourth and fifth low amplitude logic signals VI VI 12, VI 21, VI 22 and VI 0 to the gate electrodes of said plurality of IG-FET's and both source electrodes of said fifth and seventh IG-FET's, respectively, there being established between said first to fifth logic signals VI 11, VI 12, VI 21, VI 22 and VI 0 and said logic signal VI a relation expressed by the logical formula: VI = VI 0 + VI 11 · VI 12 + VI 21 · VI 22.

10. A level shifting circuit device according to claim 8, which further comprises at least one of a storage circuit for storing an output signal from said level shifting circuit device and a stabilizer circuit for stabilizing in terms of logic level an output signal from said storage circuit.

11. A level shifting circuit device according to claim 10, wherein said storage circuit includes a storage output terminal, fifth and sixth IG-FET's of said one conductive channel type connected in series between said storage output terminal and said first terminal, and seventh and eighth IG-FET's of said other conductive channel type connected in series between said storage output terminal and said reference voltage input terminal, the gate electrodes of said sixth and seventh IG-FET's being connected to said output terminal, the gate electrode of said fifth IG-FET being supplied with a signal having a polarity opposite to that of said second pulse signal, the gate electrode of said eighth IG-FET being supplied with said second pulse signal; and said stabilizer circuit includes ninth and tenth IG-FET's of said one conductive channel type connected in series between said first terminal and said storage output terminal, eleventh and twelfth IG-FET's of said other conductive channel type connected in series between said storage output terminal and said reference voltage input terminal, means for connecting commonly the gate electrodes of said tenth and eleventh IG-FET's, a thirteenth IG-FET of said other conductive channel type connected between said commonly connecting point and said first terminal, a fourteenth IG-FET of said other conductive channel type connected between said commonly connecting point and said reference voltage input terminal, means for connecting the substrate electrodes of said ninth and tenth IG-FET's to said first terminal, means for connecting the substrate electrodes of said eleventh and twelfth IG-FET's to said reference voltage input terminal, and means for connecting the gate terminal of said thirteenth and fourteenth IG-FET's to said storage output terminal.

12. A level shifting circuit device according to claim 10, wherein said second IG-FET is connected in parallel further to a fourth IG-FET of said other conductive channel type, and the gate electrodes of said second and fourth IG-FET's and both source electrodes of said second and fourth IG-FET's are supplied with logic signals VI 2, VI 3 and VI 1, respectively, there being established between said logic signals VI 2, VI 3 and VI 1 and said logic signal VI a relation expressed by the logical formula: VI = VI 1 + VI 2 + VI 3; said storage circuit includes a storage output terminal, a second power source terminal having a voltage of $E_2$ volt, a third power source terminal having a voltage of $E_3$ volt, a fourth power source terminal having a voltage of $E_4$ volt, fifth and sixth IG-FET's of said one conductive channel type connected in series between said storage output terminal and said fourth power source, means for connecting the substrate electrodes of the fifth and sixth IG-FET's to said second or fourth power source terminal, the gate electrode of said fifth IG-FET being supplied with a signal having a pulse height of $E_2$ volt and subjected to inversion of substantially the same third pulse signal as said second pulse signal, seventh and eighth IG-FET's of said other conductive channel type connected in series between said storage output terminal and said third power source terminal, the gate electrode of said eighth IG-FET being supplied with said third pulse signal, means for connecting the substrate electrodes of said seventh and eighth IG-FET's to a ground or said third power source terminal, means for connecting the gate electrodes of said sixth and seventh IG-FET's to said output terminal of said level shifting circuit, and a capacitor connected between said storage output terminal and ground; and said stabilizer circuit includes ninth and tenth IG-FET's of said one conductive channel type connected in series between said fourth power source terminal and said storage output terminal, means for connecting the substrate electrodes of said ninth and tenth IG-FET's to said second or fourth power source terminal, the gate electrode of said ninth IG-FET being supplied with said third pulse signal, eleventh and twelfth IG-FET's of said other conductive channel type connected in series between said storage output terminal and said third power source terminal, means for connecting the substrate electrodes of said eleventh and twelfth IG-FET's to said ground or third power source terminal, the gate electrode of said twelfth IG-FET being supplied with said third puse signal, a thirteenth IG-FET of said one conductive channel type and a fourteenth IG-FET of said other conductive channel type connected in series between said fourth power source terminal and said third power source terminal, means for connecting the gate electrodes of said thirteenth and fourteenth IG-FET's to said storage output terminal, means for connecting the substrate electrode of said thirteenth IG-FET to said second or fourth power source terminal, means for connecting the substrate electrode of said fourteenth IG-FET to said ground or third power source terminal, and means for connecting the gate electrodes of said tenth and eleventh IG-FET's commonly to the drain electrodes of said thirteenth and fourteenth IG-FET's.

13. A level shifting circuit device according to claim 10, wherein said storage circuit includes an inverter circuit having a fourth IG-FET of said one conductive channel type and a fifth IG-FET of said other conductive channel type connected in series between said first terminal and a ground, a sixth IG-FET of said one conductive channel type and a seventh IG-FET of said other conductive channel type the source electrodes of which are individually supplied with an output from said inverter and the drain electrodes of which are connected to each other, and means for connecting the substrate electrodes of said sixth and seventh IG-FET's to said first terminal and said ground, respectively, the gate electrodes of said sixth and seventh IG-FET's being supplied with a signal subjected to inversion of said second pulse signal and said second pulse signal, respectively.

14. A level shifting circuit device according to claim 1, wherein said first conductive path includes said first IG-FET; said second conductive path includes said second IG-FET connected between said output terminal and said reference voltage input terminal; and said circuit arrangement includes means for applying said first pulse signal to the gate electrode of said first IG-FET, means for applying said low amplitude logic signal commonly to the gate electrodes of said second and third IG-FET's, and means for applying a signal subjected to inversion of said second pulse signal to the source electrode of said second IG-FET through said reference voltage input terminal.

15. A level shifting circuit device according to claim 1, wherein said first conductive path includes said first IG-FET; said second conductive path includes a plurality of IG-FET's of said other conductive channel type connected in series between said output terminal and said reference voltage terminal; and said circuit arrangement includes means for applying first, second, third and fourth logic signals VI 11, VI 12, VI 21 and VI 22 to the gate electrodes of said plurality of IG-FET's, respectively, there being established between said logic signals VI 11, VI 12, VI 21 and VI 22 and said logic signal VI a relation expressed by the logical formula: VI = VI 11 · VI 12 + VI 21 · VI 22, and means for applying a signal subjected to inversion of said second pulse signal to said reference voltage input terminal.

16. A level shifting circuit device according to claim 14, which further comprises at least one of a storage circuit for storing an output from said level shifting circuit device and a stabilizer circuit for stabilizing in terms of logic level an output signal from said storage circuit.

17. A level shifting circuit device according to claim 16, wherein said storage circuit includes a storage output terminal, fourth and fifth IG-FET's of said one conductive channel type connected in series between said storage output terminal and said first terminal and sixth and seventh IG-FET's of said other conductive channel type connected in series between said storage output terminal and said reference voltage input terminal, the gate electrodes of said fifth and sixth IG-FET's being connected to said output terminal, the gate electrode of said fourth IG-FET being supplied with said signal subjected to inversion of said second pulse signal, the gate electrode of said seventh IG-FET being supplied with said second pulse signal; and said stabilizer circuit includes eighth and ninth IG-FET's of said one conductive channel type connected in series between said first terminal and said storage output terminal, tenth and eleventh IG-FET's of said other conductive channel type connected in series between said storage output terminal and said reference voltage input terminal, means for connecting commonly the gate electrodes of said ninth and tenth IG-FET's, a twelfth IG-FET of said one conductive channel type connected between said commonly connecting point and said first terminal, a thirteenth IG-FET of said other conductive channel connected between said commonly connecting point and said reference voltage input terminal, means for connecting the substrate electrodes of said eighth and ninth IG-FET's to said first terminal, the substrate electrodes of said tenth and eleventh IG-FET's being connected to said reference voltage input terminal, and means for connecting the gate electrodes of said twelfth and thirteenth IG-FET's to said storage output terminal.

18. A level shifting circuit device according to claim 16, wherein said storage circuit includes an inverter circuit having a fourth IG-FET of said one conductive channel type and a fifth IG-FET of said other conductive channel type connected in series between said first terminal and a ground, a sixth IG-FET of said one conductive channel type and a seventh IG-FET of said other conductive channel type the source electrodes of which are supplied with an output from said inverter and the drain electrodes of which are connected to each other, means for connecting the substrate electrodes of said sixth and seventh IG-FET's to said first terminal and said ground, respectively, and a capacitor connected between a connecting point for connecting the drain electrodes of said sixth and seventh IG-FET's and said ground, the gate electrodes of said sixth and seventh IG-FET's being supplied with said signal subjected to inversion of said second pulse signal and said second pulse signal, respectively.

19. A level shifting circuit device according to claim 1, wherein said first conductive path includes said first IG-FET of said one conductive channel type connected between said first terminal and said output terminal; said second conductive path includes said second IG-FET of said other conductive channel type connected between said output terminal and said reference voltage input terminal; and said circuit arrangement includes an AND gate circuit whose output terminal is connected to the gate electrode of said second IG-FET, means for supplying said second pulse signal and said low amplitude logic signal to the input terminals of said AND circuit, and means for grounding said reference voltage input terminal.

* * * * *

UNITED STATES PATENT OFFICE
CERTIFICATE OF CORRECTION

Patent No. 3,976,984    Dated August 24, 1976

Inventor(s) Masataka HIRASAWA

It is certified that error appears in the above-identified patent and that said Letters Patent are hereby corrected as shown below:

Please add the following to the face of the Grant:

--Priority: Japanese Applications 55354/74; 55355/74; 55356/74; 55357/74; and 55358/74, all filed May 20, 1974.--

Signed and Sealed this

Twenty-first Day of December 1976

[SEAL]

Attest:

RUTH C. MASON
*Attesting Officer*

C. MARSHALL DANN
*Commissioner of Patents and Trademarks*